(12) United States Patent
Juvekar et al.

(10) Patent No.: US 11,650,241 B1
(45) Date of Patent: May 16, 2023

(54) INCREMENTAL QUANTITIES-BASED FAULT LOCATING TECHNIQUE AND SYSTEM

(71) Applicant: Schweitzer Engineering Laboratories, Inc., Pullman, WA (US)

(72) Inventors: Gandhali P Juvekar, Pullman, WA (US); Yajian Tong, Houston, TX (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/809,406

(22) Filed: Jun. 28, 2022

(51) Int. Cl.
*G01R 31/08* (2020.01)

(52) U.S. Cl.
CPC .................. *G01R 31/086* (2013.01)

(58) Field of Classification Search
CPC ................................................ G01R 31/086
USPC .......................................................... 324/604
See application file for complete search history.

(56) References Cited

U.S. PATENT DOCUMENTS

| | | | |
|---|---|---|---|
| 4,161,011 A | 7/1979 | Wilkinson | |
| 4,405,966 A | 8/1983 | Cavero | |
| 4,825,327 A | 4/1989 | Alexander | |
| 5,140,492 A | 8/1992 | Schweitzer | |
| 5,703,745 A | 12/1997 | Roberts | |
| 6,028,754 A | 2/2000 | Guzman-Casillas | |
| 6,721,671 B2 | 4/2004 | Roberts | |
| 7,660,088 B2 | 2/2010 | Mooney | |
| 8,410,785 B2 | 4/2013 | Calero | |
| 8,525,522 B2 | 9/2013 | Gong | |
| 8,558,551 B2 | 10/2013 | Mynam | |
| 8,736,297 B2 | 5/2014 | Yelgin | |
| 8,942,954 B2 | 1/2015 | Gong | |
| 9,257,827 B2 | 2/2016 | Calero | |
| 10,162,015 B2 | 12/2018 | Xu | |
| 10,197,614 B2 | 2/2019 | Benmouyal | |
| 10,261,567 B2 | 4/2019 | Mynam | |
| 10,436,831 B2 | 10/2019 | Kang | |
| 10,649,020 B2 | 5/2020 | Achanta | |
| 11,169,195 B2 | 11/2021 | Naidu | |
| 11,346,878 B2 | 5/2022 | Benmouyal | |
| 11,598,800 B2 | 3/2023 | Kasztenny | |
| 2009/0150099 A1 | 6/2009 | Balcerek | |
| 2011/0264389 A1 | 10/2011 | Mynam | |
| 2012/0004867 A1 | 1/2012 | Mousavi | |

(Continued)

OTHER PUBLICATIONS

Benmouyal, Gabriel; Fischer, Normann; Smyth, Bryan: "Performance Comparison Between Mho Elements and Incremental Quantity-Based Distance Elements" Jan. 30, 2017.

(Continued)

*Primary Examiner* — Farhana A Hoque
(74) *Attorney, Agent, or Firm* — Fletcher Yoder, P.C.

(57) ABSTRACT

A technique and a system are used to analyze incremental quantities. The instantaneous electrical measurements associated with a loop in a multiple-phase electric power delivery system are obtained before a fault occurred on the loop and after the same fault occurred on the same loop, and differences between the instantaneous electrical measurements at different times are used to determine incremental quantities, which are used to determine a location of the fault on the loop. Multiple loops in the multiple-phase electric power delivery system are monitored to determine corresponding fault locations on each loop.

20 Claims, 3 Drawing Sheets

(56) References Cited

U.S. PATENT DOCUMENTS

| | | |
|---|---|---|
| 2014/0236502 A1 | 8/2014 | Calero |
| 2014/0351472 A1 | 11/2014 | Jebson |
| 2017/0003335 A1 | 1/2017 | Kang |
| 2017/0227611 A1 | 8/2017 | Xu |
| 2018/0136269 A1* | 5/2018 | Schweitzer, III ...... G01R 31/11 |
| 2022/0308103 A1 | 9/2022 | Kasztenny |

OTHER PUBLICATIONS

Kaszi Enny, Bogdan: "Distance Elements for Line Protection Applications Near Unconventional Sources" Schweitzer Engineering Laboratories, Inc. Jun. 2021.

Kasztenny, Bogdan: "Short-Circuit Protection in Networks with Unconventional Power Sources" PAC World Magazine, Mar. 2021.

\* cited by examiner

INCREMENTAL QUANTITIES-BASED FAULT LOCATING TECHNIQUE AND SYSTEM

BACKGROUND

This disclosure relates to locating faults in electric power delivery systems. More particularly, this disclosure relates to determining a fault location in electric power delivery systems by using incremental quantities.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of any kind.

DETAILED DESCRIPTION

Figure 1:
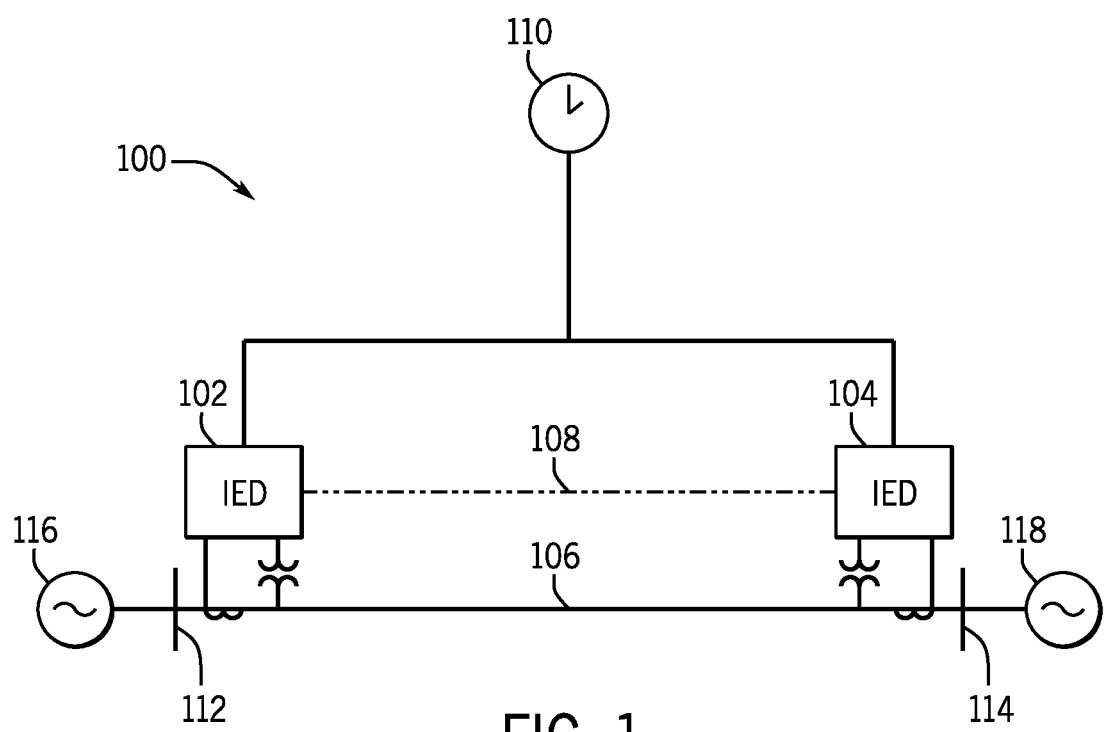
FIG. 1 is a block diagram of a system for determining a fault location using the incremental quantities, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Certain examples commensurate in scope with the originally claimed subject matter are discussed below. These examples are not intended to limit the scope of the disclosure. Indeed, the present disclosure may encompass a variety of forms that may be similar to or different from the examples set forth below.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

As used herein, the terms "connect," "connection," "connected," "in connection with," and "connecting" are used to mean "in direct connection with" or "in connection with via one or more elements"; and the term "set" is used to mean "one element" or "more than one element." Further, the terms "couple," "coupling," "coupled," "coupled together," and "coupled with" are used to mean "directly coupled together" or "coupled together via one or more elements."

In addition, as used herein, the terms "real time", "real-time", or "substantially real time" may be used interchangeably and are intended to describe operations (e.g., computing operations) that are performed without any human-perceivable interruption between operations. For example, as used herein, data relating to the systems described herein may be collected, transmitted, and/or used in control computations in "substantially real time" such that data readings, data transfers, and/or data processing steps occur once every second, once every 0.1 second, once every 0.01 second, or even more frequent, during operations of the systems (e.g., while the systems are operating). In addition, as used herein, the terms "continuous", "continuously", or "continually" are intended to describe operations that are performed without any significant interruption. For example, as used herein, control commands may be transmitted to certain equipment every five minutes, every minute, every 30 seconds, every 15 seconds, every 10 seconds, every 5 seconds, or even more often, such that operating parameters of the equipment may be adjusted without any significant interruption to the closed-loop control of the equipment. In addition, as used herein, the terms "automatic", "automated", "autonomous", and so forth, are intended to describe operations that are performed are caused to be performed, for example, by a computing system (i.e., solely by the computing system, without human intervention). Indeed, although certain operations described herein may not be explicitly described as being performed continuously and/or automatically in substantially real time during operation of the computing system and/or equipment controlled by the computing system, it will be appreciated that these operations may, in fact, be performed continuously and/or automatically in substantially real time during operation of the computing system and/or equipment controlled by the computing system to improve the functionality of the computing system (e.g., by not requiring human intervention, thereby facilitating faster operational decision-making, as well as improving the accuracy of the operational decision-making by, for example, eliminating the potential for human error), as described in greater detail herein.

The embodiments of the disclosure will be best understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. In some cases, well-known features, structures or operations are not shown or described in detail. Furthermore, the described features, structures, or operations may be combined in any suitable manner in one or more embodiments. The components of the embodiments as generally described and illustrated in the figures could be arranged and designed in a wide variety of different configurations.

Several aspects of the embodiments described may be implemented as software modules or components. As used herein, a software module or component may include any type of computer instruction or computer-executable code located within a memory device and/or transmitted as electronic signals over a system bus or wired or wireless network. A software module or component may, for instance, include physical or logical blocks of computer instructions, which may be organized as a routine, program, object, component, data structure, or the like, and which performs a task or implements a particular abstract data type.

In certain embodiments, a particular software module or component may include disparate instructions stored in different locations of a memory device, which together implement the described functionality of the module. Indeed, a module or component may include a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a tangible, non-transitory, computer-readable and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, compact disc read-only memories (CD-ROMs), digital versatile disc read-only memories (DVD-ROMs), read-only memories (ROMs), random access memories (RAMs), erasable programmable read-only memories (EPROMs), electrically erasable programmable read-only memories (EEPROMs), magnetic or optical cards, solid-state memory devices, or other types of machine-readable media suitable for storing electronic and/or processor executable instructions.

With the forgoing in mind, the present disclosure is related to electric power delivery systems and improved systems and method for identifying fault locations in power delivery systems. Before continuing, it should be understood that faster transmission line protection improves power system stability in power delivery systems. If faults are not cleared before the critical fault clearing time, the system may lose transient stability and possibly suffer a black out. In addition, faster fault clearing increases the amount of power that can be transferred. Faster protection also enhances public and utility personnel safety, limits equipment wear, improves power quality, and reduces property damage.

Most protection principles are based on the fundamental frequency components of voltages and currents. Accurate measurement of a sinusoidal quantity typically takes a cycle. An analysis of transient components may be undertaken in connection with various embodiments of the present disclosure. Further, information relating to electrical conditions may be communicated among devices to provide end-to-end transmission line protection.

Various embodiments consistent with the present disclosure may analyze incremental quantities, which are determined by real-time signals that appear due to a fault and do not contain load voltages or currents. Incremental quantities may simplify the line and system representation by eliminating power sources and leaving the fault as the only "source" in the equivalent network. By way of example, instantaneous electrical measurements associated with a loop in a multiple-phase electric power delivery system may be obtained before a fault occurred on the loop and after the same fault occurred on the same loop, and differences between the instantaneous electrical measurements at different time may give insight into information related to the fault (e.g., fault location).

In certain embodiments, sensors (e.g., electrical sensors, temperature sensors, intelligent electronic devices (IEDs), and so forth) may be used and powered by a battery (e.g., rechargeable battery, either standing alone or connected to a power system, which may be charged when power is available), or by an additional power supply (e.g., power backup system, solar panel power system or other alternative power system, and so forth), or any combination of them (e.g., converting to other power supply methods when there is an outage on one power supply). The sensors may be coupled to an existing monitoring system, or stand alone. The sensors may be installed on a mobile device. The sensors may be used to monitor the electric power delivery system for a period of time. As such, the sensors may work on a demand, may be easily coupled to an existing system, may be portable. In certain embodiments, the sensors may measure values of electrical operating parameters of a particular loop in a multiple-phase electric power delivery system, and send the sensor data to an electrical monitoring system.

In certain embodiments, the electrical monitoring system may receive instantaneous measurements of electrical operating parameters at a local terminal and a remote terminal on a particular loop before a fault occurred on the loop, such that the fault occurred at a location between the local terminal and the remote terminal. The electrical monitoring system may then receive instantaneous measurements of electrical operating parameters at the local terminal and the remote terminal of the particular loop after the fault occurred on the loop. With this in mind, the electrical monitoring system may compare the values of the operating parameters measured at the local terminal (or the remote terminal) before the fault occurred on the loop and after the fault occurred on the same loop to obtain respective incremental quantities for the local terminal (or the remote terminal).

In certain embodiments, the electrical monitoring system may then use incremental quantities for a local terminal and a remote terminal on a particular loop to determine the fault location between the local terminal and the remote terminal by using methods and techniques described in greater detail herein. The electrical monitoring system may send instructions to activate certain actions (e.g., protective actions) based on the determined fault location.

In certain embodiments, the electrical monitoring system may monitor incremental quantities for local terminals and remote terminals on more than one loops in a multiple-phase electric power delivery system in order to determine the fault location on a particular loop. For instance, a ground fault situation and location may be identified by the electrical monitoring system based on the monitored incremental quantities for respective local terminals and respective remote terminals on multiple loops within the multiple-phase electric power delivery system. Indeed, by monitoring the incremental quantities for respective local terminal and respective remote terminal on the multiple loops, the electrical monitoring system may be able to determine the fault locations on additional loops of the multiple-phase electric power delivery system. In addition, each of the above described embodiments may be performed continuously to provide for real-time monitoring and fault location identification.

By way of introduction, FIG. 1 illustrates a block diagram of a system 100 for determining and calculating a location of a fault using incremental quantities further described herein. System 100 may include generation, transmission, distribution and/or similar systems. System 100 includes a conductor 106, such as a transmission line connecting two nodes, which are illustrated as a local terminal 112 and a remote terminal 114. The local terminal 112 and the remote terminal 114 may be part of buses in a transmission system supplied by generators 116 and 118, respectively. Although illustrated in single line form for purposes of simplicity, system 100 may be a multi-phase system, such as a three-phase electric power delivery system.

System 100 may be monitored by IEDs (or other suitable sensors, such as electrical sensors or temperature sensors, and so forth) 102 and 104 at two locations of the system, although further IEDs may also be utilized to monitor further locations of the system. As used herein, an IED (such as IEDs 102 and 104) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. The IEDs 102 and 104 may obtain electric power system information using current transformers (CTs), potential transformers (PTs), Rogowski coils, voltage dividers and/or the like. The IEDs 102, 104 may be capable of using inputs from conventional instrument transformers such as CTs and PTs conventionally used in monitoring of electric power delivery. The IEDs 102 and 104 may also receive common time information from a common time source 110.

A common time source 110 may be any time source capable of delivering a common time signal to each of IEDs 102 and 104. Some examples of a common time source include a Global Navigational Satellite System (GNSS) such as the Global Positioning System (GPS) delivering a time signal corresponding with IRIG, a WVWB or WVW system, a network-based system such as corresponding with IEEE 1588 precision time protocol, and/or the like. According to one embodiment, common time source 110 may comprise a satellite-synchronized clock (e.g., Model No. SEL-2407, available from SEL). Further, it should be noted that each IED 102, 104 may be in communication with a separate clock, such as a satellite-synchronized clock, with each clock providing each IED 102, 104 with a common time signal. The common time signal may be derived from a GNSS system or other time signal.

A data communication channel 108 may allow the IEDs 102 and 104 to exchange information relating to, among other things, voltages, currents, fault detections, fault locations, and the like. According to some embodiments, a time signal based on common time source 110 may be distributed to and/or between IEDs 102 and 104 using data communication channel 108. Data communication channel 108 may be embodied in a variety of media and may utilize a variety of communication protocols. For example, the data communication channel 108 may be embodied utilizing physical media, such as coaxial cable, twisted pair, fiber optic, etc. Further, the data communication channel 108 may utilize communication protocols such as Ethernet, SONET, SDH, or the like, in order to communicate data.

In several embodiments herein, incremental quantities may be used to determine and calculate location of a fault. Fault related voltages and current signals are determined directly from time synchronized signals. These fault signals are a sum of pre-fault signals and fault-generated signals. Hence, the fault generated signals are a difference between fault signals and the pre-fault signals. One simple method to compute incremental quantities is:

$$\Delta s_{(t)} = s_{(t)} - s_{(t-pT)} \qquad (1)$$

where $\Delta s_{(t)}$ is the instantaneous incremental quantity at time t, $s_{(t)}$ is the measured instantaneous value of a quantity at time t, T is the period of the measured quantity, p is an arbitrary number of periods, and $s_{(t-pT)}$ is the measured instantaneous value of the quantity at time (t-pT). That is, the instantaneous incremental quantity at time t is determined by comparing the measured instantaneous values of the quantity at time t and at time (t-pT). Using the above equation, an instantaneous incremental quantity that lasts for p power cycles can be obtained. The value of p may be selected based on the intended usage of the instantaneous incremental quantity. For example, if the incremental quantities are intended to be used during two power cycles, p can be more than 2.

Figure 2:
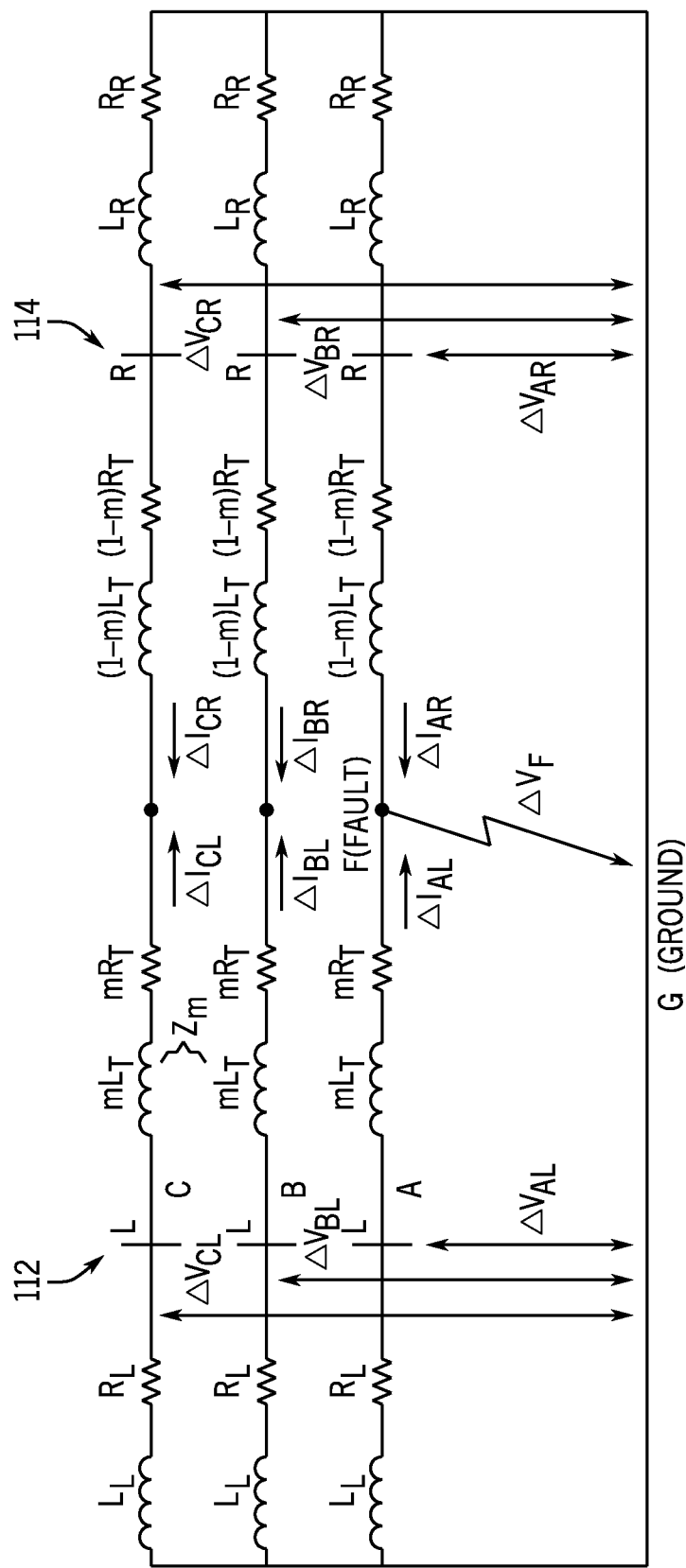
FIG. 2 illustrates an equivalent three-phase network with a local Terminal L and a remote Terminal R, with a fault on a line between terminals L and R, in accordance with an embodiment.

With this in mind, the incremental quantities may be used to determine a location of a fault within an electrical network. For instance, FIG. 2 illustrates an equivalent three-phase network that has a fault on phase AG (i.e., phase A to ground) between terminals L 112 and R 114 consistent with certain embodiments of the present disclosure. The terminal L 112 and the remote Terminal R 114 may include sensor units that detect electrical properties, such as voltage and current, at the respective locations in the three-phase network. The fault network contains incremental voltages and currents that may be used for protection of the network as further described herein. Based on the fault network illustrated in FIG. 2, fault voltage $\Delta v_F$ may be determined based on measurements acquired at the terminal L 112. That is, at the terminal L 112 of the network, the instantaneous incremental voltage between phase A and ground $\Delta v_{AL}$, and the instantaneous incremental currents $\Delta i_{AL}$, $\Delta i_{BL}$, $\Delta i_{CL}$ are related by a simple voltage drop equation across the terminal L 112 illustrated by equation (in the phasor domain):

$$\Delta V_{AL} - m \cdot (Z_s \Delta I_{AL} + Z_m \cdot (\Delta I_{BL} + \Delta I_{CL})) = \Delta V_F \qquad (2)$$

where $Z_s$ is self-impedance of transmission line impedance, $Z_m$ is the mutual impedance between the phases, and m is the per unit fault location from the terminal L 112. In some embodiments, it may be assumed that the system has balanced impedances, which means symmetrical lines, and $Z_s$ and $Z_m$ are both complex quantities. As such, equation (2) above can be written as:

$$\Delta V_{AL} - m \cdot (Z_s \Delta I_{AL} - Z_m \cdot \Delta I_{AL} + Z_m \cdot (\Delta I_{AL} + \Delta I_{BL} + \Delta I_{CL})) = \Delta V_F \quad (3)$$

Where $\Delta V_{AL}$ represents the phasor fault voltage between phase A and ground at the fault location. Now, setting $3\Delta I_{0L}$ equal to $\Delta I_{AL} + \Delta I_{BL} + \Delta I_{CL}$ as provided in equation (4) below, equation (3) can be rewritten as equations (5A and 5B)

$$\Delta I_{AL} + \Delta I_{BL} + \Delta I_{CL} = 3\Delta I_{0L} \quad (4)$$

$$\Delta V_{AL} - m \cdot ((Z_s - Z_m) \cdot \Delta I_{AL} + Z_m \cdot (3\Delta I_{0L})) = \Delta V_F \quad (5A)$$

$$\Delta V_{AL} - m \cdot \left(Z_{1T} \cdot \Delta I_{AL} + \frac{(Z_{0T} - Z_{1T})}{3} \cdot (3\Delta I_{0L})\right) = \Delta V_F \quad (5B)$$

Here, for a transmission line system with balanced impedances, $$Z_{1T} = Z_s - Z_m \quad (6)$$

$$Z_m = \frac{(Z_{0T} - Z_{1T})}{3} \quad (7)$$

$Z_{1T}$ and $Z_{0T}$ are the positive sequence and the zero-sequence transmission line impedances, respectively, for a system with balanced impedances.

Similarly, the incremental voltage from the remote side (with subscript "R" indicating terminal R) is expressed in Equation 5C:

$$\Delta V_{AR} - (1-m) \cdot \left(Z_{1T} \cdot \Delta I_{AR} + \frac{(Z_{0T} - Z_{1T})}{3} \cdot (3\Delta I_{0R})\right) = \Delta V_F \quad (5C)$$

By applying equations (6) and (7) to equations (5), and equating equations 5B and 5C, equations (8) may be expressed as follows:

$$\Delta V_{AL} - m \cdot \left(Z_{1T} \Delta I_{AL} + \frac{(Z_{0T} - Z_{1T})}{3} \cdot (3\Delta I_{0L})\right) = \quad (8A)$$

$$\Delta V_{AR} - (1-m) \cdot \left(Z_{1T} \Delta I_{AR} + \frac{(Z_{0T} - Z_{1T})}{3} \cdot (3\Delta I_{0R})\right)$$

$$\Delta V_{AL} - \Delta V_{AR} = m \cdot Z_{1T}(\Delta V_{AL} + \Delta V_{AR}) + \quad (8B)$$

$$m \cdot (Z_{0T} - Z_{1T}) \cdot (\Delta I_{0L} + \Delta I_{0R}) - Z_{1T} \cdot \Delta I_{AR} - (Z_{0T} - Z_{1T}) \cdot (3\Delta I_{0R})$$

Where:

$$\Delta I_Z = \frac{Z_{1T} \cdot (\Delta I)}{|Z_{1T}|};$$

and, $$\Delta I_{Z0} = -\frac{(Z_{0T} - Z_{1T}) \cdot (\Delta I_0)}{|Z_{1T}|}$$

Now we have equation 9 in phasor-domain quantities:

$$\Delta V_{AL} - \Delta V_{AR} = m \cdot |Z_{1T}|(\Delta I_{Z,AL} - \Delta I_{Z,0L} + \Delta I_{Z,AR} - \Delta I_{Z,0R}) - |Z_{1T}| \cdot (\Delta I_{Z,AR} - \Delta I_{Z,0R}) \quad (9)$$

Using phasor-domain quantities may introduce delays as long as one cycle. In systems with inverter-based resources, for example, the fault data may not be available for even as long as one cycle. Inverters act fast and usable data available could be less than one cycle. Accordingly, the presently disclosure introduces methods using instantaneous incremental quantities to capture necessary data without significant delay.

Accordingly, equation 9 may be analyzed in time-domain as described below. Equation 10 may be used to obtain instantaneous replica currents, $$\Delta i_Z = \left(\frac{R_{1T}}{|Z_{1T}|} \cdot (\Delta i) + \frac{L_{1T}}{|Z_{1T}|} \cdot \frac{d(\Delta i)}{dt}\right) \quad (10)$$

Where:

$$Z_{1T} = R_{1T} + i*(2\pi f * L_{1T}); \text{ and,}$$

$$\Delta i_{z0} = -\left(\frac{R_{0T} - R_{1T}}{|Z_{1T}|} \cdot (\Delta i_0) + \frac{L_{0T} - L_{1T}}{|Z_{1T}|} \cdot \frac{d(\Delta i_0)}{dt}\right)$$

Using instantaneous replica currents, Equation 9 may be written in instantaneous form as Equation 11:

$$\Delta v_{AL} - \Delta v_{AR} = m \cdot |Z_{1T}|(\Delta i_{Z,AL} - \Delta i_{Z,0L} + \Delta i_{Z,AR} - \Delta i_{Z,0R}) - |Z_{1T}| \cdot (\Delta i_{Z,AR} - \Delta i_{Z,0R}) \quad (11)$$

Then, m, the per unit fault location from terminal L 112, is determined by $$m = \frac{\Delta v_{AL} - \Delta v_{AR} + |Z_{1T}|(\Delta i_{Z,AR} - \Delta i_{Z,0R})}{|Z_{1T}| \cdot ((\Delta i_{Z,AL} - \Delta i_{Z,0L}) + (\Delta i_{Z,AR} - \Delta i_{Z,0R}))} \quad (12)$$

For the same AG fault, the BG loop may also be considered as shown below:

$$\Delta V_{BL} - m \cdot \left(Z_{1T} \Delta I_{BL} + \frac{(Z_{0T} - Z_{1T})}{3} \cdot (3\Delta I_{0L})\right) + \quad (13)$$

$$(1-m) \cdot \left(Z_{1T} \Delta I_{BR} + \frac{(Z_{0T} - Z_{1T})}{3} \cdot (3\Delta I_{0R})\right) - \Delta V_{BR} = 0$$

Here, $\Delta I_{BL} \sim 0$, $\Delta I_{BR} \sim 0$, because the fault is an AG fault and there should be no or a negligible amount of change in the B-phase current at both local and remote terminals.

Equation 13 may be solved for the BG loop similar to the solution of the AG loop, above in the time domain becomes equation 14:

$$\Delta v_{BL} - \Delta v_{BR} = m \cdot |Z_{1T}|(\Delta i_{Z,BL} - \Delta i_{Z,0L} + \Delta i_{Z,BR} - \Delta i_{Z,0R}) - |Z_{1T}| \cdot (\Delta i_{Z,BR} - \Delta i_{Z,0R}) \quad (14)$$

And the per unit fault location from terminal L 112, is determined by $$m = \frac{\Delta v_{BL} - \Delta v_{BR} + |Z_{1T}|(\Delta i_{Z,BR} - \Delta i_{Z,0R})}{|Z_{1T}| \cdot ((\Delta i_{Z,BL} - \Delta i_{Z,0L}) + (\Delta i_{Z,BR} - \Delta i_{Z,0R}))} \quad (15)$$

For the same AG fault, now consider the AB loop:

$$\Delta V_{AL} - m \cdot \left( Z_{1T} \Delta I_{AL} + \frac{(Z_{0T} - Z_{1T})}{3} \cdot (3\Delta I_{0L}) \right) + \quad (16)$$

$$(1-m) \cdot \left( Z_{1T} \Delta I_{AR} + \frac{(Z_{0T} - Z_{1T})}{3} \cdot (3\Delta I_{0R}) \right) -$$

$$\Delta V_{AR} + \Delta V_{BR} - (1-m) \cdot \left( Z_{1T} \Delta I_{BR} + \frac{(Z_{0T} - Z_{1T})}{3} \cdot (3\Delta I_{0R}) \right) +$$

$$m \cdot \left( Z_{1T} \Delta I_{BL} + \frac{(Z_{0T} - Z_{1T})}{3} \cdot (3\Delta I_{0L}) \right) - \Delta V_{BL} = 0$$

Solving Equation 16 following the solution to the AG loop in the time domain yields equation 17:

$$\Delta v_{AL} - m \cdot |Z_{1T}| \cdot (\Delta i_{Z,AL} - \Delta i_{Z,0L}) + (1-m) \cdot |Z_{1T}| \cdot (\Delta i_{Z,AR} - \Delta i_{Z,0R}) - \Delta v_{AR} + \Delta v_{BR} - (1-m) \cdot |Z_{1T}| \cdot (\Delta i_{Z,BR} - \Delta i_{Z,0R}) + m \cdot |Z_{1T}| \cdot (\Delta i_{Z,BL} - \Delta i_{Z,0L}) - \Delta v_{BL} = 0 \quad (17)$$

The per unit fault location from terminal L 112, is determined by $$m = \frac{(\Delta v_{AL} - \Delta v_{BL}) - (\Delta v_{AR} - \Delta v_{BR}) + |Z_{1T}| \cdot (\Delta i_{Z,AR} - \Delta i_{Z,BR})}{|Z_{1T}| \cdot \{(\Delta i_{Z,AL} - \Delta i_{Z,BL}) + (\Delta i_{Z,AR} - \Delta i_{Z,BR})\}} \quad (18)$$

It can be shown that m obtained from the AB loop, i.e. Equation (18), is the same as the m obtained from the AG loop, i.e. Equation (12). Equation (18) can be rearranged as:

$$\Delta v_{AL} - \Delta v_{AR} - m \cdot |Z_{1T}| (\Delta i_{Z,AL} + \Delta i_{Z,AR}) + |Z_{1T}| \cdot (\Delta i_{Z,AR}) = \Delta v_{BL} - \Delta v_{BR} - m \cdot |Z_{1T}| (\Delta i_{Z,BL} + \Delta i_{Z,BR}) + |Z_{1T}| \cdot (\Delta i_{Z,BR}) \quad (19)$$

Substituting equation (15), $$\Delta v_{AL} - \Delta v_{AR} - m \cdot |Z_{1T}| (\Delta i_{Z,AL} + \Delta i_{Z,AR}) + |Z_{1T}| \cdot (\Delta i_{Z,AR}) = m \cdot |Z_{1T}| (\Delta i_{Z,BL} - \Delta i_{Z,0L} + \Delta i_{Z,BR} - \Delta i_{Z,0R}) - |Z_{1T}| \cdot (\Delta i_{Z,BR} - \Delta i_{Z,0R}) - m \cdot |Z_{1T}| (\Delta i_{Z,BL} + \Delta i_{Z,BR}) + |Z_{1T}| \cdot (\Delta i_{Z,BR}) \quad (20)$$

Here, $\Delta i_{Z,BL} \approx 0$; $\Delta i_{Z,BR} \approx 0$, because the fault is an AG fault and there should be no or a negligible amount of change in the B-phase current at both local and remote terminals.

$$\Delta v_{AL} - \Delta v_{AR} - m \cdot |Z_{1T}| (\Delta i_{Z,AL} + \Delta i_{Z,AR}) + |Z_{1T}| \cdot (\Delta i_{Z,AR}) = m \cdot |Z_{1T}| (-\Delta i_{Z,0L} - \Delta i_{Z,0R}) - |Z_{1T}| \cdot (-\Delta i_{Z,0R}) \quad (21)$$

Therefore, $$m = \frac{\Delta v_{AL} - \Delta v_{AR} + |Z_{1T}| \cdot (\Delta i_{Z,AR} - \Delta i_{Z,0R})}{|Z_{1T}| \cdot ((\Delta i_{Z,AL} - \Delta i_{Z,0L}) + (\Delta i_{Z,AR} - \Delta i_{Z,0R}))} = \quad (22)$$

$$\frac{(\Delta v_{AL} - \Delta v_{BL}) - (\Delta v_{AR} - \Delta v_{BR}) + |Z_{1T}|(\Delta i_{Z,AR} - \Delta i_{Z,BR})}{|Z_{1T}| \cdot \{(\Delta i_{Z,AL} - \Delta i_{Z,BL}) + (\Delta i_{Z,AR} - \Delta i_{Z,BR})\}}$$

For the same AG fault, now consider the CG loop in time domain:

$$\Delta v_{CL} - \Delta v_{CR} = m \cdot |Z_{1T}| (\Delta i_{Z,CL} - \Delta i_{Z,0L} + \Delta i_{Z,CR} - \Delta i_{Z,0R}) - |Z_{1T}| \cdot (\Delta i_{Z,CR} - \Delta i_{Z,0R}) \quad (23)$$

Solving this loop (similar to solving AG loop), $$m = \frac{\Delta v_{CL} - \Delta v_{CR} + |Z_{1T}|(\Delta i_{Z,CR} - \Delta i_{Z,0R})}{|Z_{1T}| \cdot ((\Delta i_{Z,CL} - \Delta i_{Z,0L}) + (\Delta i_{Z,CR} - \Delta i_{Z,0R}))} \quad (24)$$

Then, the CA loop result in equation (25), $$m = \frac{(\Delta v_{AL} - \Delta v_{CL}) - (\Delta v_{AR} - \Delta v_{CR}) + |Z_{1T}| \cdot (\Delta i_{Z,AR} - \Delta i_{Z,CR})}{|Z_{1T}| \cdot \{(\Delta i_{Z,AL} - \Delta i_{Z,CL}) + (\Delta i_{Z,AR} - \Delta i_{Z,CR})\}} \quad (25)$$

Similar to the AB loop, it can be shown that m obtained from the CA loop is the same as the AG loop.

The BC loop does not give the same per unit fault location m because the fault is an AG fault and there will be no or a negligible amount of change in the B-phase and C-phase currents at both local and remote terminals causing large errors in the per unit fault location computation. In this way, the present embodiments described herein allows for a valid fault location to be obtained as long as the phase involved in the fault is included in the phase-phase loop used for incremental quantities-based fault location calculation. This relationship is illustrated in Table 1.

TABLE 1

Loops and Fault Types

| Loop | Detectable Fault Types |
|---|---|
| AG | AG, BG, CG, AB, CA, ABG, BCG, CAG, ABC |
| BG | AG, BG, CG, AB, BC, ABG, BCG, CAG, ABC |
| CG | AG, BG, CG, BC, CA, ABG, BCG, CAG, ABC |
| AB | AG, BG, AB, BC, CA, ABG, BCG, CAG, ABC |
| BC | BG, CG, AB, BC, CA, ABG, BCG, CAG, ABC |
| CA | AG, CG, AB, BC, CA, ABG, BCG, CAG, ABC |

Incremental quantities used for calculation of loops listed in Table 1 are listed in Table 2:

TABLE 2

Incremental quantities for calculation of m

| Loop | Voltage | Current |
|---|---|---|
| AG | $\Delta v_{AL}, \Delta v_{AR}$ | $(\Delta i_{Z,AL} - \Delta i_{Z,0L}), (\Delta i_{Z,AR} - \Delta i_{Z,0R})$ |
| BG | $\Delta v_{BL}, \Delta v_{BR}$ | $(\Delta i_{Z,BL} - \Delta i_{Z,0L}), (\Delta i_{Z,BR} - \Delta i_{Z,0R})$ |
| CG | $\Delta v_{CL}, \Delta v_{CR}$ | $(\Delta i_{Z,CL} - \Delta i_{Z,0L}), (\Delta i_{Z,CR} - \Delta i_{Z,0R})$ |
| AB | $(\Delta v_{AL} - \Delta v_{BL}),$ $(\Delta v_{AR} - \Delta v_{BR})$ | $(\Delta i_{Z,AL} - \Delta i_{Z,BL}), (\Delta i_{Z,AR} - \Delta i_{Z,BR})$ |
| BC | $(\Delta v_{BL} - \Delta v_{CL}),$ $(\Delta v_{BR} - \Delta v_{CR})$ | $(\Delta i_{Z,BL} - \Delta i_{Z,CL}), (\Delta i_{Z,BR} - \Delta i_{Z,CR})$ |
| CA | $(\Delta v_{CL} - \Delta v_{AL}),$ $(\Delta v_{CR} - \Delta v_{AR})$ | $(\Delta i_{Z,CL} - \Delta i_{Z,AL}), (\Delta i_{Z,CR} - \Delta i_{Z,AR})$ |

Because zero-sequence impedance is generally not accurately known, the incremental quantities for three phase-phase loops, i.e. AB, BC, and CA, may be used either in combination or all, to determine fault location for all fault types.

Figure 3:
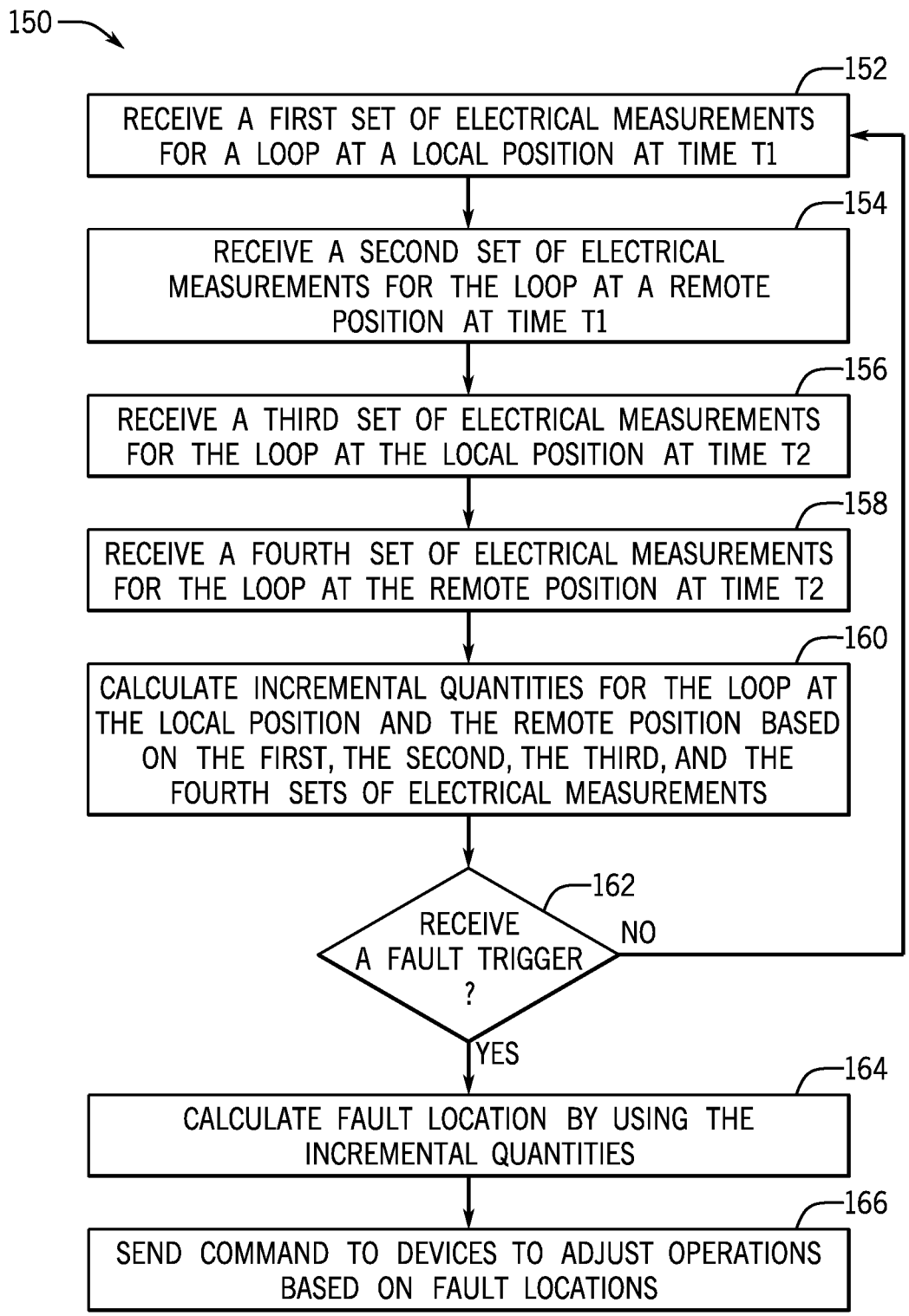
FIG. 3 is a flowchart of a method for determining a location of a fault using the incremental quantities, in accordance with an embodiment.

FIG. 3 illustrate a flow chart of a method 150 for determining the fault location in accordance with embodiments described herein. Although the following description of the method 150 is described as being performed in a particular order, it should be noted that the method 150 may be performed in any suitable order. Moreover, it should be noted that the method 150 may be performed by any suitable computing system that may have certain processing capabilities. Further, the flow chart in FIG. 3 may be refined/enhanced based on system requirements.

For instance, the computing system may include a communication component, a processor, a memory, a storage, input/output (I/O) ports, a display, and the like. The communication component may facilitate communication between the computing system and the terminals L 112 and R 114 and any other suitable communication-enabled devices.

The processor may be any type of computer processor or microprocessor capable of executing computer-executable code. The processor may also include multiple processors that may perform the operations described below. The memory and the storage may be any suitable articles of manufacture that can serve as media to store processor-executable code, data, or the like. These articles of manufacture may represent computer-readable media (e.g., any suitable form of memory or storage) that may store the processor-executable code used by the processor to perform the presently disclosed techniques. The memory and the storage may store data, various other software applications for analyzing the data, and the like. The memory and the storage may represent non-transitory computer-readable media (e.g., any suitable form of memory or storage) that may store the processor-executable code used by the processor to perform various techniques described herein. It should be noted that non-transitory merely indicates that the media is tangible and not a signal.

The I/O ports may be interfaces that may couple to other peripheral components such as input devices (e.g., keyboard, mouse), sensors, input/output (I/O) modules, and the like. The display may operate to depict visualizations associated with software or executable code being processed by the processor. In an embodiment, the display may be a touch display capable of receiving inputs from a user. The display may be any suitable type of display, such as a liquid crystal display (LCD), plasma display, or an organic light emitting diode (OLED) display, for example.

Referring now to FIG. 3, at block 152 and block 154, the computing system may receive the real-time and synchronized signals of electrical measurements at a first time t1 for a loop from the terminal L 112 and the terminal R 114. In some embodiments, the terminals L 112 and R 114 may include the IEDs 102 and 104, respectively, which may measure the electrical properties at the respective locations. The electrical measurements may include voltage measurements, current measurements, and the like in accordance to the equations described above (e.g., equation 2). The IEDs 102 and 104 may then send data related to the electrical measurements to the computing system.

At block 156 and block 158, the computing system may receive the real-time and synchronized signals of electrical measurements at as second time t2 after the first time t1 for a loop from the IEDs 102 and 104 located at the terminal L 112 and the terminal R 114. At block 160, the computing system may determine the incremental quantities for the loop according to Table 2.

At block 162, the computing system may determine whether a fault is present based on receiving a notification of a fault trigger from any suitable device. For example, the fault trigger may be received from a remote device, which is outside of the system 100. The computing system may calculate the incremental quantities in response to receiving the fault trigger.

For example, the IED 102 may measure the real-time phase A to ground voltage at the terminal L 112, $v_{AL}(t)$, at times t1 and t2, and the computing system may calculate the corresponding instantaneous incremental quantity $\Delta v_{AL}$ according to:

$$\Delta v_{AL} = v_{AL}(t2) - v_{AL}(t1). \quad (27)$$

Similarly, the IED 104 may measure the real-time phase A to ground voltage at position R 114, $v_{AR}(t)$, at times t1 and t2, and the computing system may calculate the corresponding instantaneous incremental quantity $\Delta v_{AR}$ according to:

$$\Delta v_{AR} = v_{AR}(t2) - v_{AR}(t1). \quad (28)$$

Here, $v_{AR}(t)$ and $v_{AL}(t)$ are synchronized by the common time source 110. Similarly, the incremental quantities for currents at the terminal L 112 and the terminal R 114 can be calculated by the computing system.

The above analysis indicates that a valid fault location can be obtained when the phase involved in the fault is included in the phase-phase loop using an incremental quantities-based fault location computation. Also, phase-ground loops give fault locations for most fault types, excluding phase-phase faults that do not involve the phase that is used in the phase-ground loop, but they need to use zero sequence impedance information. Hence, the computing system may use the phase-phase loops to determine fault locations for 9 out of 10 fault types. If all three phase-phase loops are used for fault location computation, the computing system may use 2 out of 3 phase-phase loops to determine a valid fault location for a phase-ground fault and each of the three phase-phase loops may be used to determine a valid fault location for all the other fault types. It should be noted that the fault location mentioned in the embodiments described above pertains to per unit fault location, but this output can be used to calculate the actual fault location in miles or kilometers if the total line length is mentioned. Thus, technical effects of the present disclosure include systems and methods for using incremental quantities to determine fault location.

The present system and method have advantages over existing technology. First, no sequence quantities required for fault location computation in the present system. This helps with systems containing IBRs (Inverter Based Resources), where a reliable negative sequence current is unavailable. Second, the present system and method eliminate dependency of zero sequence incremental loop compensated current and hence, zero sequence impedance. Indeed, all 6 loops can be used but it was observed that the phase-ground loops had a higher error. This is because zero sequence impedance is seldom accurately known. Moreover, the present system and method are applicable to both instantaneous and filtered incremental quantities, but using instantaneous signals instead of filtered signals eliminates the longer filtering delays associated with them. Additionally, the present system and method is also a good alternative for travelling-wave (TW) fault location method for faults occurring near a point-on-wave zero and if the line is terminated with a high impedance element as it becomes a challenge to measure the current TW for such systems. Furthermore, fault type identification is not necessary in the present system and method, which avoids errors associated or challenges faced by fault identification methods. And there are only three phase-to-phase loops are used for fault location computation and a reliable fault location result can be obtained in just over a power system cycle.

After the fault and its location are determined, the computing system may send commands to related devices (e.g., contactors, relays, circuit breakers) to adjust operations based on the fault location at block 166. For example, the operations might include a protective action, which may include opening or closing a circuit breaker, selectively isolating a portion of the electric power system via the breaker, etc. In various embodiments, the protective action may involve coordinating protective actions with other devices in communication with the system 100. In addition, the fault location computation can be used during post-processing actions to provide more visibility into the system like system parameters.

Furthermore, some depictions of logic circuitry have been described via this disclosure. It should be understood that logically-equivalent circuitry may be used herein to implement the systems and methods described. For example, a logical XOR gate may be replaced via a logically-equivalent combination of NOT gates, AND gates, Inverse NOT gates, OR gates, NAND gates, NOR gates, or the like.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

Indeed, the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A method configured to determine a fault location in a multiple-phase electric power delivery system, comprising:
   receiving, via a processor, a first set of instantaneous electrical measurements associated with a loop within the multiple-phase electric power delivery system from a first set of sensors, wherein the first set of instantaneous electrical measurements comprises a first current measurement, a first voltage measurement, or both associated with the loop;
   receiving, via the processor, a second set of instantaneous electrical measurements associated with the loop from a second set of sensors, wherein the second set of instantaneous electrical measurements comprises a second current measurement, a second voltage measurement, or both associated with the loop, wherein the first set of sensors are located at a different location on the loop as compared to the second set of sensors;
   receiving, via the processor, a third set of instantaneous electrical measurements associated with the loop from the first set of sensors after receiving the first set of instantaneous electrical measurements, wherein the third set of instantaneous electrical measurements comprises a third current measurement, a third voltage measurement, or both associated with the loop;
   receiving, via the processor, a fourth set of instantaneous electrical measurements associated with the loop from the second set of sensors after receiving the second set of instantaneous electrical measurements, wherein the fourth set of instantaneous electrical measurements comprises a fourth current measurement, a fourth voltage measurement, or both associated with the loop;
   determining, via the processor, a set of incremental quantities based on:
     a first comparison between the first set of instantaneous electrical measurements and the third set of instantaneous electrical measurements; and
     a second comparison between the second set of instantaneous electrical measurements and the fourth set of instantaneous electrical measurements;
   receiving, via the processor, an indication of a presence of a fault;
   determining, via the processor, a fault location based on the set of incremental quantities in response to receiving the indication; and
   sending one or more commands to one or more devices to adjust one or more operations based on the fault location.

2. The method of claim 1, wherein the loop comprises a phase-to-phase loop.

3. The method of claim 1, wherein the loop comprises a phase-to-ground loop.

4. The method of claim 1, wherein the fault location is determined only based on the set of incremental quantities and an impedance associated with each transmission line of the multiple-phase electric power delivery system.

5. The method of claim 4, wherein the impedance excludes a zero sequence impedance.

6. The method of claim 1, wherein the indication of the presence of the fault is received from an external device or a device associated with the processor.

7. The method of claim 1, comprising:
   determining, via the processor, that the fault is not present on the loop based on the set of incremental quantities;
   receiving, via the processor, a fifth set of instantaneous electrical measurements associated with an additional loop different from the loop within the multiple-phase electric power delivery system from a third set of sensors during a first time period corresponding to the first set of instantaneous electrical measurements, wherein the fifth set of instantaneous electrical measurements comprises a fifth current measurement, a fifth voltage measurement, or both associated with the additional loop;
   receiving, via the processor, a sixth set of instantaneous electrical measurements associated with the additional loop from the third set of sensors during a second time period corresponding to the third set of instantaneous electrical measurements, wherein the sixth set of instantaneous electrical measurements comprises a sixth current measurement, a sixth voltage measurement, or both associated with the additional loop;
   determining, via the processor, an additional set of incremental quantities based on:
     a third comparison between the first set of instantaneous electrical measurements and the third set of instantaneous electrical measurements; and a fourth comparison between the fifth set of instantaneous electrical measurements and the sixth set of instantaneous electrical measurements;

receiving, via the processor, an additional indication of an additional presence of an additional fault on the additional loop;

determining, via the processor, an additional fault location based on the additional set of incremental quantities; and sending one or more additional commands to one or more additional devices to adjust one additional or more operations based on the additional fault location.

8. The method of claim 1, wherein the first set of sensors and the second set of sensors comprise intelligent electronic devices.

9. The method of claim 1, wherein the one or more devices comprises a circuit breaker, and wherein the one or more operations are associated with opening or closing the circuit breaker.

10. A system, comprising:
a first sensor configured to acquire a first set of instantaneous electrical measurements associated with a first location on a loop of a multiple-phase electric system at a first time and a second set of instantaneous electrical measurements associated with the first location at a second time after the first time;
a second sensor configured to acquire a third set of instantaneous electrical measurements associated with a second location on the loop at the first time and a fourth set of instantaneous electrical measurements associated with the second location at the second time; and
a processor configured to:
receive the first set of instantaneous electrical measurements, the second set of instantaneous electrical measurements, the third set of instantaneous electrical measurements, and the fourth set of instantaneous electrical measurements;
determine a set of incremental quantities based on:
a first comparison between the first set of instantaneous electrical measurements and the third set of instantaneous electrical measurements; and
a second comparison between the second set of instantaneous electrical measurements and the fourth set of instantaneous electrical measurements;
receive an indication of a presence of a fault;
determine a fault location based on the set of incremental quantities in response to receiving the indication; and
send one or more commands to one or more devices to adjust one or more operations based on the fault location.

11. The system of claim 10, wherein the multiple-phase electric system comprises a plurality of phases, wherein the loop comprises a phase-to-phase loop, and wherein the fault location is determined for a location on each loop of the plurality of phases.

12. The system of claim 10, wherein the multiple-phase electric system comprises a plurality of phases, wherein the loop comprises a phase-to-ground loop from at least one of the plurality of phases and a ground location, and wherein the fault location corresponds to a location on a portion of the plurality of phases.

13. The system of claim 10, wherein the fault location is determined based only on the set of incremental quantities and a positive sequence impedance associated with each transmission line of the multiple-phase electric system.

14. The system of claim 13, wherein determining the fault location excludes a zero sequence impedance associated with the multiple-phase electric system.

15. The system of claim 10, wherein the indication of the presence of the fault is received from an external device or a device associated with the processor.

16. The system of claim 10, wherein the one or more devices comprise a circuit breaker, and wherein the one or more operations are associated with opening or closing the circuit breaker.

17. A non-transitory computer-readable medium comprising computer-executable instructions that, when executed, are configured to cause at least one processor to perform operations comprising:
receiving a first set of instantaneous electrical measurements associated with a loop within a multiple-phase electric power delivery system from a first set of sensors, wherein the first set of instantaneous electrical measurements comprises a first current measurement, a first voltage measurement, or both associated with the loop;
receiving a second set of instantaneous electrical measurements associated with the loop from a second set of sensors, wherein the second set of instantaneous electrical measurements comprises a second current measurement, a second voltage measurement, or both associated with the loop, wherein the first set of sensors are located at a different location on the loop as compared to the second set of sensors;
receiving a third set of instantaneous electrical measurements associated with the loop from the first set of sensors after receiving the first set of instantaneous electrical measurements, wherein the third set of instantaneous electrical measurements comprises a third current measurement, a third voltage measurement, or both associated with the loop;
receiving a fourth set of instantaneous electrical measurements associated with the loop from the second set of sensors after receiving the second set of instantaneous electrical measurements, wherein the fourth set of instantaneous electrical measurements comprises a fourth current measurement, a fourth voltage measurement, or both associated with the loop;
determining a set of incremental quantities based on:
a first comparison between the first set of instantaneous electrical measurements and the third set of instantaneous electrical measurements; and
a second comparison between the second set of instantaneous electrical measurements and the fourth set of instantaneous electrical measurements;
receiving an indication of a presence of a fault;
determining a fault location based on the set of incremental quantities in response to receiving the indication; and
sending one or more commands to one or more devices to adjust one or more operations based on the fault location.

18. The non-transitory computer-readable medium of claim 17, wherein the loop comprises a phase-to-phase loop.

19. The non-transitory computer-readable medium of claim 17, wherein the loop comprises a phase-to-ground loop.

20. The non-transitory computer-readable medium of claim 19, wherein the computer-executable instructions comprising:

receiving a fifth set of instantaneous electrical measurements associated with an additional loop different from the loop within the multiple-phase electric power delivery system from a third set of sensors at the same time as receiving the first set of instantaneous electrical measurements, wherein the fifth set of instantaneous electrical measurements comprises a fifth current measurement, a fifth voltage measurement, or both associated with the additional loop;

receiving a sixth set of instantaneous electrical measurements associated with the additional loop from the third set of sensors at the same time as receiving the third set of instantaneous electrical measurements, wherein the sixth set of instantaneous electrical measurements comprises a sixth current measurement, a sixth voltage measurement, or both associated with the additional loop;

determining an additional set of incremental quantities based on:
- a third comparison between the first set of instantaneous electrical measurements and the third set of instantaneous electrical measurements; and
- a fourth comparison between the fifth set of instantaneous electrical measurements and the sixth set of instantaneous electrical measurements;

receiving an additional indication of an additional presence of an additional fault on the additional loop;

determining an additional fault location based on the additional set of incremental quantities; and sending one or more additional commands to one or more additional devices to adjust one additional or more operations based on the additional fault location.

* * * * *